United States Patent [19]

Okamoto

[11] Patent Number: 5,760,630
[45] Date of Patent: Jun. 2, 1998

[54] INPUT PROTECTION CIRCUIT HAVING LOAD RESISTOR IMPLEMENTED BY P-CHANNEL MIS TRANSISTOR

[75] Inventor: Toshiharu Okamoto, Tokyo, Japan

[73] Assignee: NEC Corporation, Tokyo, Japan

[21] Appl. No.: 599,352

[22] Filed: Feb. 9, 1996

[30] Foreign Application Priority Data

Feb. 10, 1995 [JP] Japan .................................. 7-046487

[51] Int. Cl.⁶ .................................................. H02H 9/04
[52] U.S. Cl. ........................ 327/310; 327/318; 257/360; 257/361; 361/56; 361/91
[58] Field of Search ................................. 361/56, 58, 91, 361/111; 327/310, 313, 318, 327, 328; 257/355–357, 360, 361

[56] References Cited

U.S. PATENT DOCUMENTS

| | | |
|---|---|---|
| 4,449,158 | 5/1984 | Taira .................................. 361/91 |
| 4,858,055 | 8/1989 | Okitaka .............................. 327/313 |
| 4,937,700 | 6/1990 | Iwahashi ............................ 361/91 |
| 5,170,241 | 12/1992 | Yoshimura et al. ................ 259/339 |
| 5,291,051 | 3/1994 | Hoang et al. ...................... 257/360 |
| 5,397,934 | 3/1995 | Merrill et al. ...................... 327/537 |
| 5,534,723 | 7/1996 | Iwai et al. .......................... 257/360 |
| 5,543,734 | 8/1996 | Volk et al. .......................... 327/328 |
| 5,545,909 | 8/1996 | Williams et al. ................... 361/91 |

*Primary Examiner*—Timothy P. Callahan
*Assistant Examiner*—Eunja Shin
*Attorney, Agent, or Firm*—Sughrue, Mion, Zinn, Macpeak & Seas, PLLC

[57] ABSTRACT

An input protection circuit which protects a first-stage inverter circuit against an electrostatic surge. The input protection circuit includes n-channel MIS type punch-through transistor for discharging the electrostatic surge to a ground terminal and a p-channel MIS type load transistor coupled between a signal input pad and the n-channel MIS type punch-through transistor, the p-channel MIS type load transistor having a gate and a back-gate concurrently applied with the electrostatic surge so that a dielectric breakdown hardly takes place in a gate insulating film.

2 Claims, 6 Drawing Sheets

INPUT PROTECTION CIRCUIT HAVING LOAD RESISTOR IMPLEMENTED BY P-CHANNEL MIS TRANSISTOR

FIELD OF THE INVENTION

This invention relates to a semiconductor integrated circuit device and, more particularly, to a semiconductor integrated circuit device having an input protection circuit.

DESCRIPTION OF THE RELATED ART

A plurality of MOS (Metal-Oxide-Semiconductor) field effect transistors form in combination an integrated circuit, and the integrated circuit achieves a task through selective switching actions of the MOS field effect transistors. The MOS field effect transistor is switched between on-state and off-sate depending upon a potential level applied to the gate electrode thereof. The gate oxide film electrically isolates the gate electrode from the channel region, and the potential level at the gate electrode varies the channel conductance through the electrostatic induction across the gate oxide film. Therefore, a thin gate oxide film is desirable, and the gate oxide films of standard MOS field effect transistors are of the order of hundreds angstroms thick.

The gate oxide film is thick enough to withstand the potential variation of a standard electric signal. However, when electrostatic surge is applied through a lead to the gate electrode, the thin gate oxide film is liable to be broken down.

In order to prevent the gate oxide film from the dielectric breakdown, an input protection circuit is incorporated in the integrated circuit, and is expected to protect the MOS field effect transistors against an electrostatic surge.

FIG. 1 shows a typical example of the protection circuit associated with a first-stage inverter circuit 1. The first-stage inverter circuit 1 forms a part of an integrated circuit fabricated on a semiconductor chip 2, and is implemented by a series connection of a p-channel enhancement type MOS transistor 1a and an n-channel enhancement type MOS transistor 1b coupled between a positive power voltage line Vdd and a ground line GND.

The prior art protection circuit 3 comprises two resistors 3a and 3b and an n-channel enhancement type MOS transistor 3c. The resistor 3a is connected between a pad 4 and the gate electrodes of the p-channel/n-channel enhancement type MOS transistors 1a and 1b, and the other resistor 3b and the n-channel enhancement type MOS transistor 3c are coupled in series between the pad 4 and a ground terminal 5. The gate electrode of the n-channel enhancement type MOS transistor 3c is connected to the source node thereof and, accordingly, the ground terminal 5.

The pad 4 is connected to an external lead (not shown), and transfers an electric signal from the external lead through the resistor 3a to the first-stage inverter circuit 1. The electric signal swings the potential level within a narrow range, and the ground voltage maintains the n-channel enhancement type MOS transistor 3c in the off-state. For this reason, the electric signal is propagated through the resistor 3a, and switches the first-stage inverter circuit 1.

When the external lead is brought into contact with a charged body, an electrostatic surge is applied through the external lead to the pad 4. In this situation, the prior art protection circuit 3 behaves as follows. The electrostatic surge is propagated through the resistor 3b, and reaches the drain region of the n-channel enhancement type MOS transistor 3c. The electrostatic surge causes the depletion layer to extend from the drain region into the channel region, and the depletion layer finally bridges the channel region between the drain region and the source region. The punch-through phenomenon takes place, and the channel region enters into the negative resistance regions. For this reason, the n-channel enhancement type MOS transistor 3c is hereinbefore referred to as "punch-through transistor". As a result, the channel resistance becomes approximately zero, and the n-channel enhancement type MOS transistor 3c transfers the electrostatic surge to the ground terminal 5. The resistor 3a introduce delay into the propagation of the electrostatic surge, and the electrostatic surge hardly reaches the gate electrodes of the n-channel/p-channel MOS transistors 1a and 1b before the discharge through the n-channel enhancement type punch-through transistor 3c.

FIG. 2 illustrates the voltage-to-current characteristics of the prior art protection circuit 3. The n-channel enhancement type punch-through transistor 3c and the resistor 3b trace plots PL1 and PL2, respectively, and the punch-through causes the n-channel enhancement type punch-through transistor 3c to operate in a region NR on the plots PL1. The resistor 3b not only determines the operating point of the n-channel enhancement type punch-through transistor 3c but also restricts the current passing through the n-channel enhancement type punch-through transistor 3c so as to prevent the punch-through transistor 3c from destruction.

Although the resistor 3b is usually implemented by a polysilicon strip or an impurity region formed in the semiconductor chip 2, an n-channel enhancement type MOS transistor 3d is available for a load element as shown in FIG. 3. In FIG. 3, the gate electrode of the n-channel enhancement type MOS transistor 3d is connected through a resistor 3e to the positive power voltage line Vdd, and the n-channel enhancement type MOS transistor 3d is turned on at all times. The back-gate of the n-channel enhancement type MOS transistor 3d is connected to the ground terminal 5. The pad 4 is connected through the channel region of the n-channel enhancement type MOS transistor 3d to the drain region of the n-channel enhancement type punch-through transistor 3c, and the channel of the n-channel enhancement type MOS transistor 3d serves as the load resistor 3b.

In another prior art protection circuit, the gate electrode of the n-channel enhancement type MOS transistor 3d is connected to the drain region thereof as shown in FIG. 4, and the back-gate of the n-channel enhancement type MOS transistor 3d is connected to the ground terminal. When the electrostatic surge is applied to the external lead, the electrostatic surge is propagated to the drain node and the gate electrode of the n-channel enhancement type MOS transistor 3d, and passes through the channel region of the n-channel enhancement type MOS transistor 3d. The channel of the n-channel enhancement type MOS transistor 3d provides a resistance against the electrostatic surge, and serves as the load resistor 3b.

The load resistance is indispensable for the n-channel enhancement type punch-through transistor 3c, and the load element is implemented by the polysilicon strip, the impurity region or the n-channel enhancement type load transistor 3d. However, problems are encountered in the load element as follows.

If the polysilicon strip or the impurity region forms the load element, the load element occupies wide area on the semiconductor chip 2, because the polysilicon and the impurity region are too small in sheet resistance.

On the other hand, the n-channel enhancement type load transistor 3d provides large channel resistance against the electrostatic surge without occupying wide area. However, the electrostatic surge sometimes breaks the gate oxide film of the n-channel enhancement type load transistor 3d, and is not reliable.

SUMMARY OF THE INVENTION

It is therefore an important object of the present invention to provide an input protection circuit which is reliable and realized in a narrow area.

The present inventor contemplated the problem, and noticed that the constant potential such as the ground potential was applied to the back-gate or the gate electrode of the n-channel enhancement type load transistor 3d. In this situation, when the electrostatic surge reached the n-channel enhancement type load transistor, an extremely large potential difference was applied across the gate oxide film, and the dielectric breakdown took place. The present inventor concluded that if the electrostatic surge was led on both sides of the gate insulating film, the gate insulating film would be prevented from the dielectric breakdown.

To accomplish the object, the present invention proposes to apply an electrostatic surge to both of a gate electrode and a back-gate of a MIS type load transistor.

In accordance with the present invention, there is provided an input protection circuit incorporated in a semiconductor integrated circuit comprising: an input protection transistor connected to a constant voltage source for discharging a large potential to said constant voltage source; and a first load element connected between an external input terminal and said input protection transistor, and implemented by a metal-insulator-semiconductor type transistor having a gate and a back-gate, which are each connected to one of source and drain nodes thereof so as to apply the large potential to both of the gate and the back-gate.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENT

Figure 1:
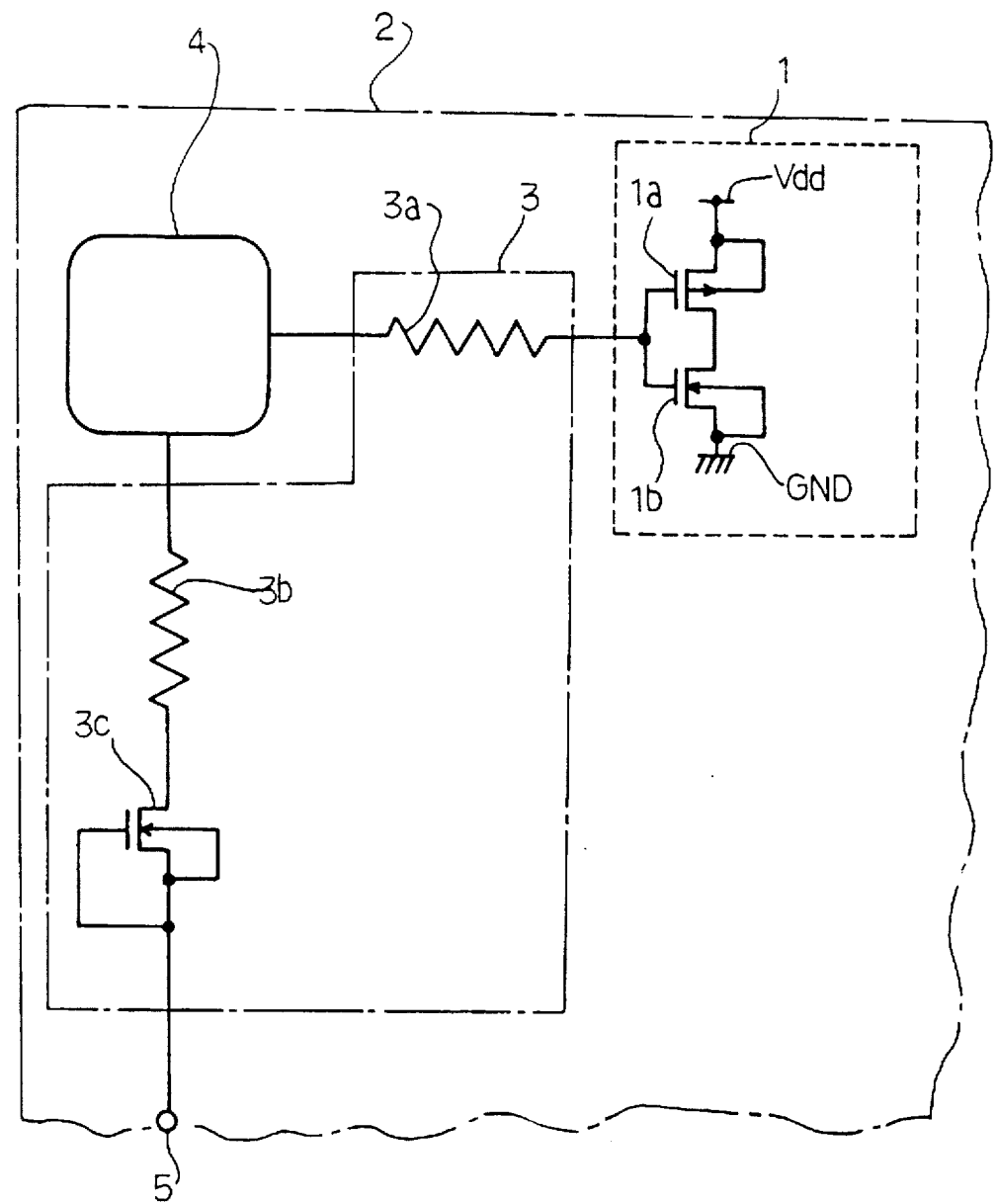
FIG. 1 is a circuit diagram showing the circuit configuration of the prior art protection circuit.
Figure 2:
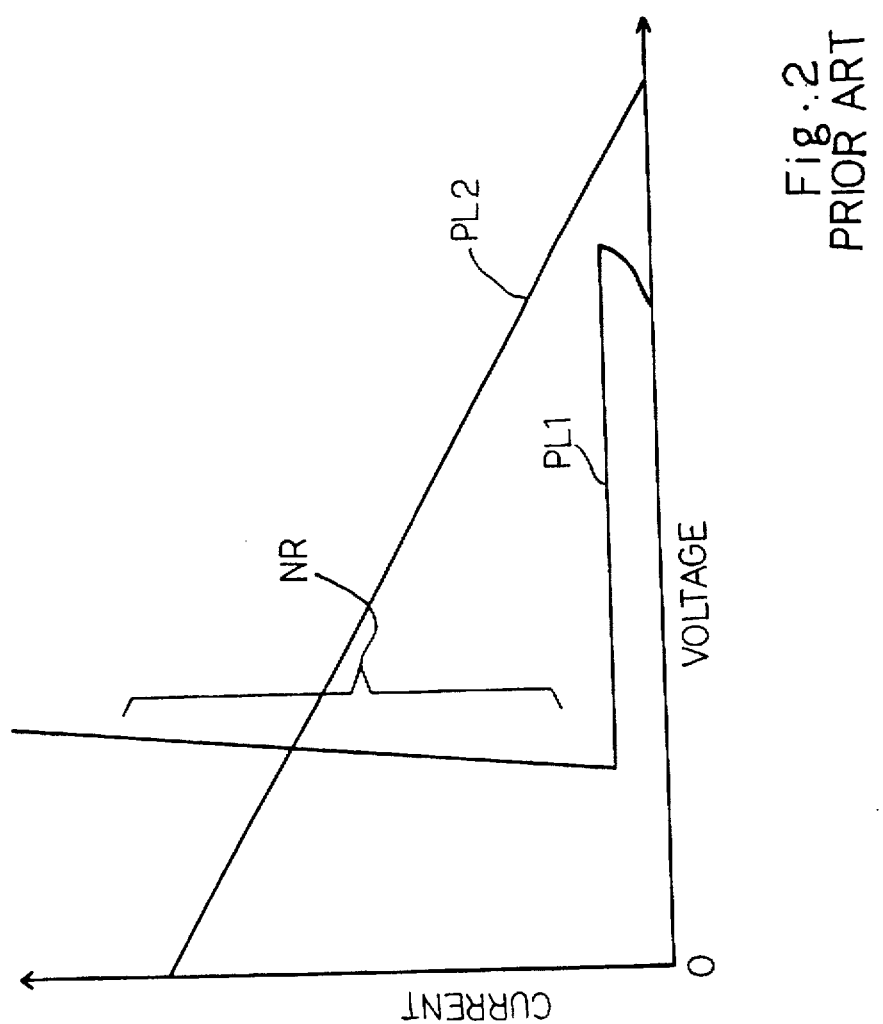
FIG. 2 is a graph showing the voltage-to-current characteristics of the prior art protection circuit.
Figure 3:
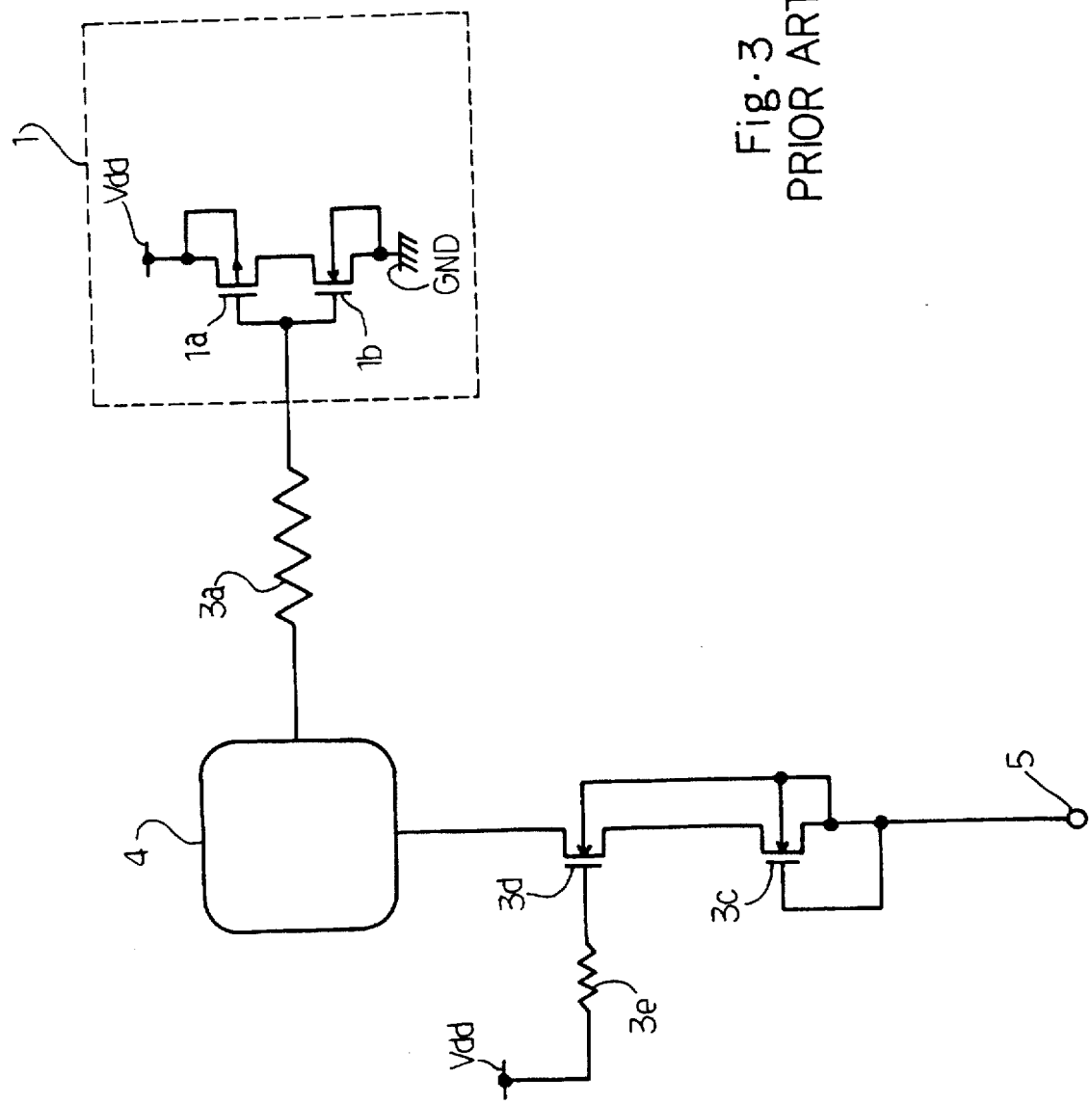
FIG. 3 is a circuit diagram showing the circuit configuration of the second prior art protection circuit.
Figure 4:
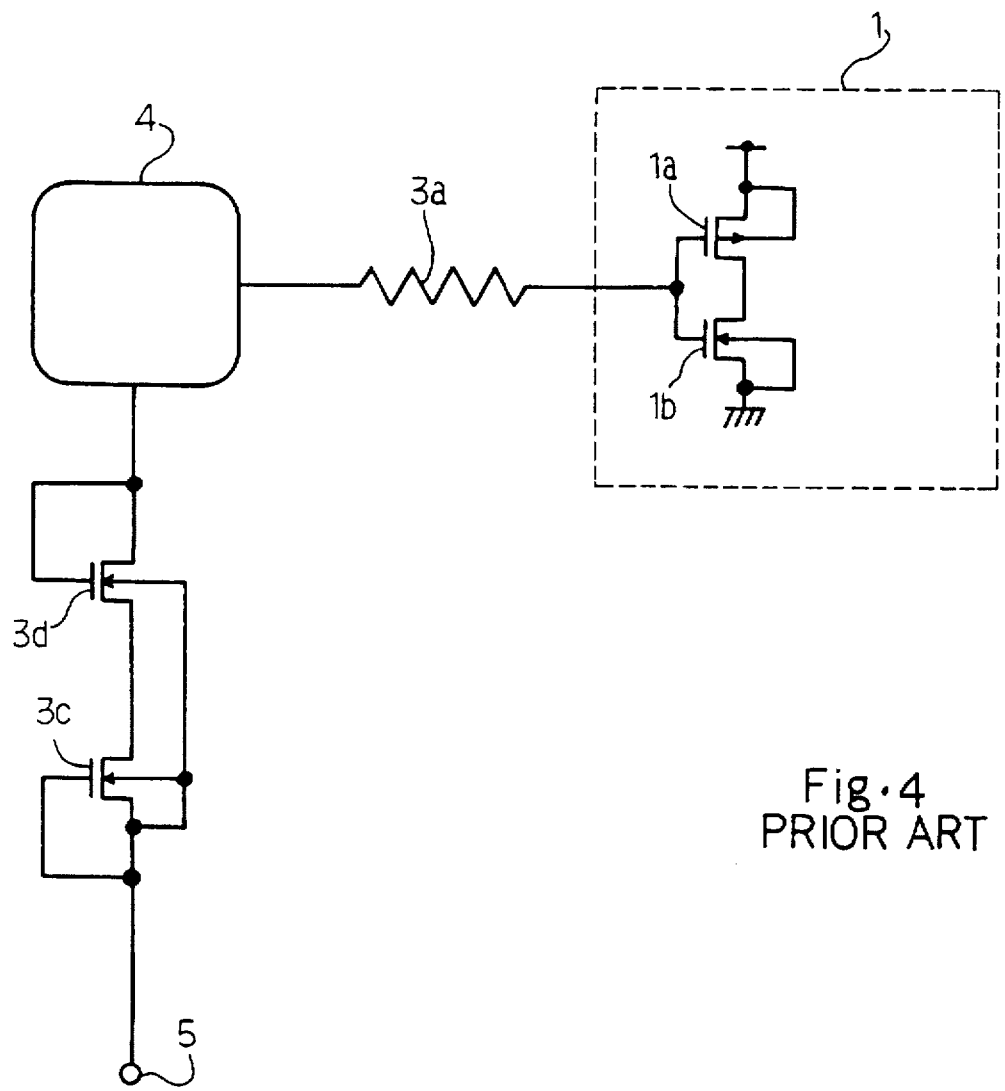
FIG. 4 is a circuit diagram showing the circuit configuration of the third prior art protection circuit.
Figure 5:
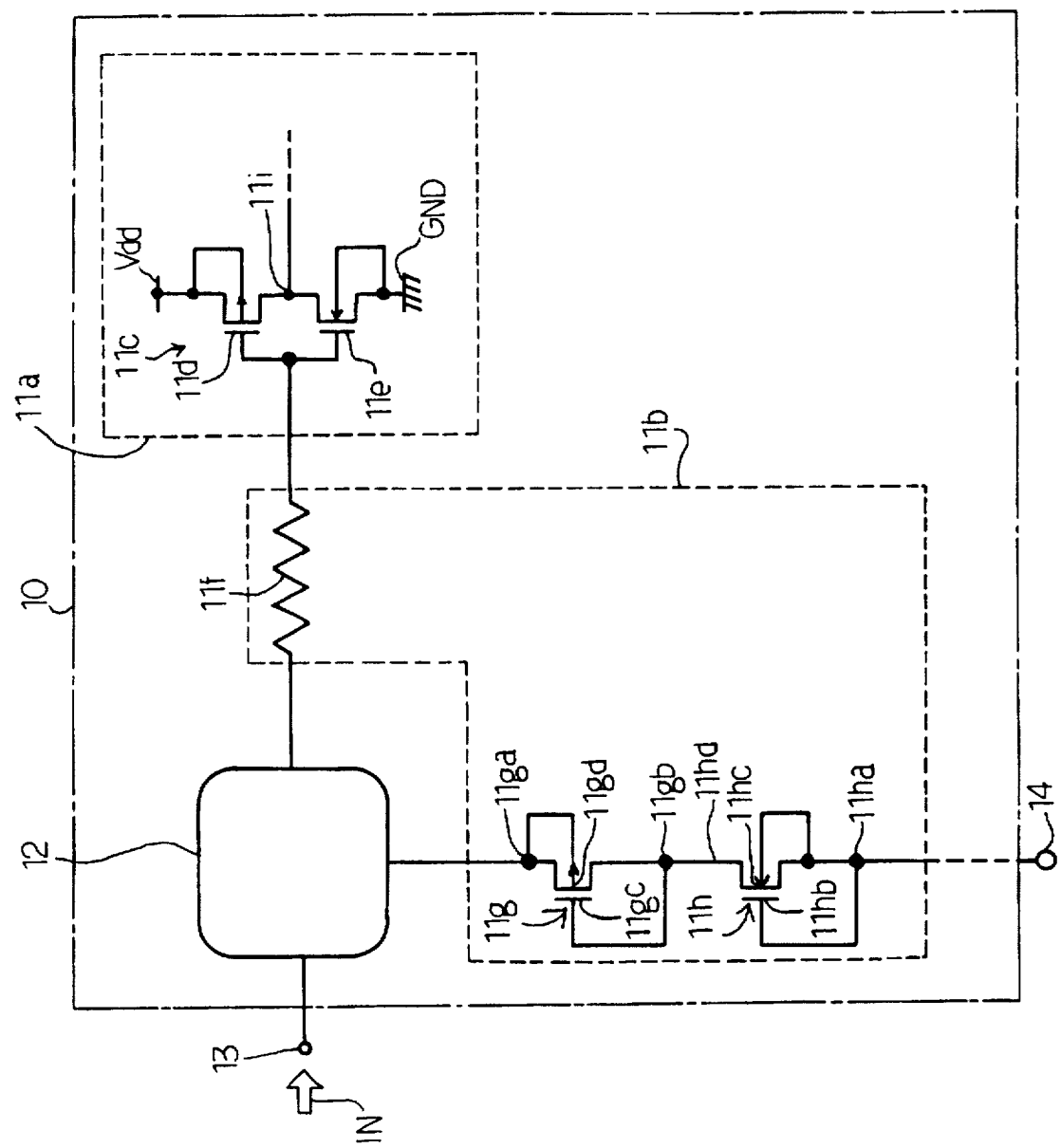
FIG. 5 is a circuit diagram showing the circuit configuration of an input protection circuit and an internal circuit according to the present invention.

Referring to FIG. 5 of the drawings, a semiconductor integrated circuit device embodying the present invention is fabricated on a semiconductor substrate 10, and an internal circuit 11a is integrated with an input protection circuit 11b on the semiconductor substrate 10. The internal circuit 11a includes a first-stage inverter circuit 11c coupled between a positive power voltage line Vdd and a ground line GND, and the first-stage inverter circuit 11c is implemented by a series of a p-channel enhancement type MIS (metal-insulator-semiconductor) field effect transistor 11d and an n-channel enhancement type MIS field effect transistor 11e. Although other circuit components are incorporated in the internal circuit 11a, FIG. 5 does now show the circuit components.

The semiconductor integrated circuit device further comprises a pad 12 connected to an external lead 13, and an input signal IN is supplied through the external lead 13 to the pad 12.

The input protection circuit includes a resistor 11f and a series combination of a p-channel type MIS load transistor 11g and an n-channel type MIS punch-through transistor 11h. The resistor 11f is connected between the pad 12 and the gate electrodes of the p-channel/n-channel enhancement type MIS field effect transistors 11d and 11e, and introduces delay into propagation of an electrostatic surge to the first-stage inverter circuit 11c.

The p-channel type MIS load transistor 11g has a source node 11ga coupled to the pad 12, a drain node 11gb coupled to the drain node of the n-channel type punch-through transistor 11h, a gate electrode 11gc coupled to the drain node 11gb and a back-gate 11gd coupled to the source node 11ga. The n-channel type MIS punch-through transistor 11h is usually turned off, and the gate electrode 11gb is electrically connected through a slightly conductive channel of the p-channel type MIS load transistor 11g to the pad 12. While the n-channel type MIS punch-through transistor 11h remains in the on-state, the p-channel type MIS load transistor 11g provides a resistance against the current passing through the conductive channel thereof, and serves as a resistor element.

On the other hand, the n-channel type punch-through transistor 11h has a source node 11ha coupled to a ground terminal 14, a gate electrode 11hb coupled to the source node 11ha, a back-gate 11hc also coupled to the source node 11ha and a drain node coupled to the drain node 11gb. The ground potential at the gate electrode 11hb removes a conductive channel from the n-channel type MIS punch-through transistor 11h, and, accordingly, the source node 11ha is electrically isolated from the drain node 11hd. However, when an extremely large potential is applied to the drain node 11hd of the n-channel type MIS punch-through transistor 11h, the punch-through phenomenon takes place, and a depletion layer connects the drain node 11hd to the source node 11ha. As a result, the n-channel type MIS punch-through transistor 11h allows large amount of current to flow into the ground terminal 14.

Figure 6:
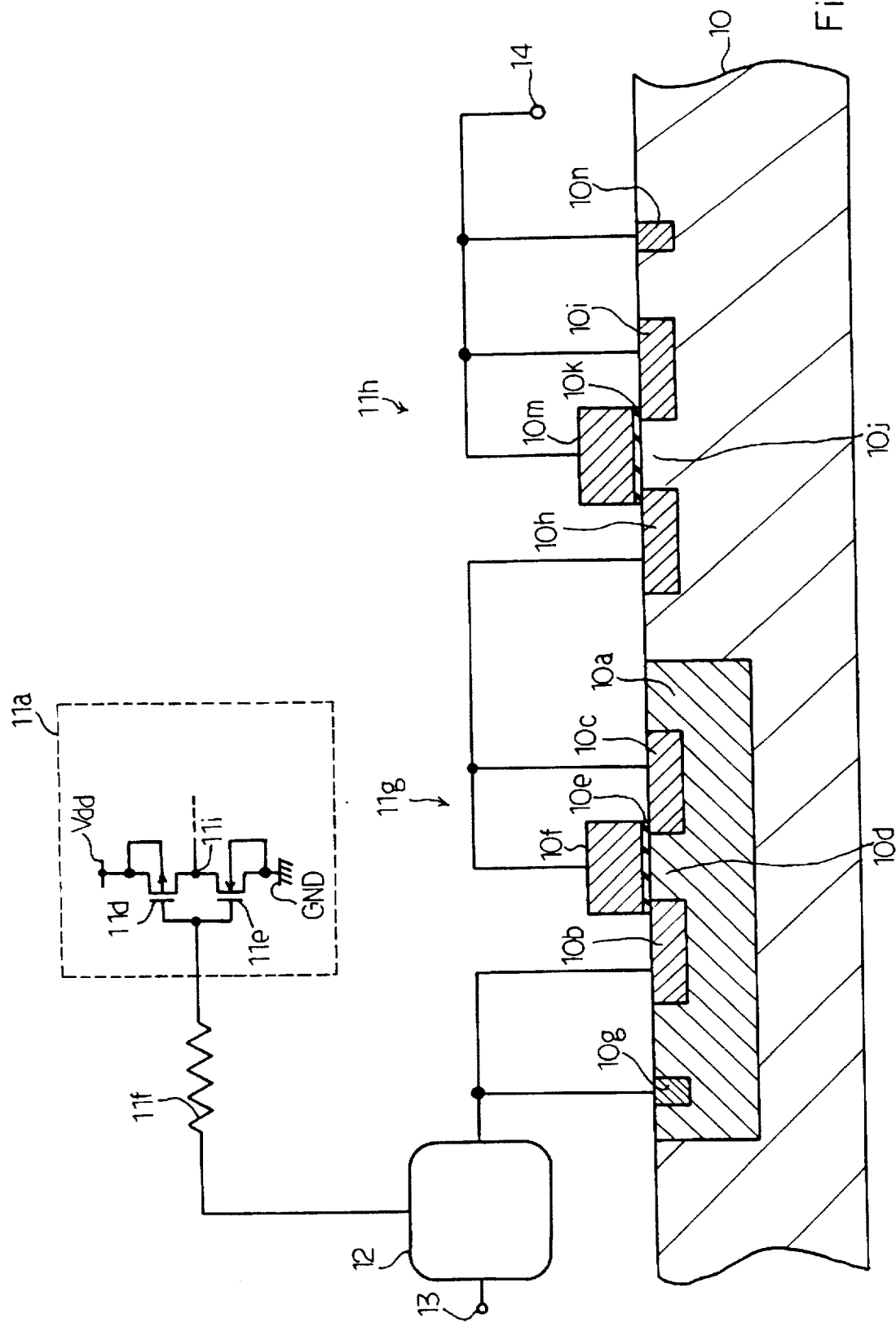
FIG. 6 is a schematic cross sectional view showing the input protection circuit fabricated on a semiconductor substrate.

FIG. 6 illustrates the structure of the p-channel type MIS load transistor 11g and the structure of the n-channel type MIS punch-through transistor 11h. The semiconductor substrate 10 is lightly doped with a p-type dopant impurity, and an n-type well 10a is formed in a surface portion of the lightly doped p-type semiconductor substrate 10. Heavily doped p-type impurity regions 10b and 10c are formed in the n-type well 10a, and are spaced apart from each other by a channel region 10d. The heavily doped p-type impurity regions 10b and 10c serve as the source node 11ga and the drain node 11gb, respectively. The channel region 10d is covered with a gate insulating film 10e, and a gate electrode 10f is formed on the gate insulating film 10e. The gate electrode 10f corresponds to the gate electrode 11gc. The heavily doped p-type region 10b is connected to the pad 12, and the gate electrode 10f is connected to the heavily doped p-type impurity region 10c.

A heavily doped n-type contact region 10g is further formed in the n-type well 10a, and the pad 12 is electrically connected to the heavily doped n-type contact region 10g. The n-type well 10a and, accordingly, the channel region 10d are biased with the potential level at the pad 12, and the channel region 10d serves as the back gate 11gd.

Thus, the p-channel type MIS load transistor 11g occupies the narrow area on the lightly doped semiconductor substrate 10, and the occupation area is much narrower than a resistor implemented by a polysilicon strip or an impurity region. Especially, the p-channel type MIS load transistor 11g transfers current through the p-type channel, and holes are smaller in mobility than electrons. For this reason, the p-type channel is larger in on-resistance than an n-type channel, and the p-channel type MIS load transistor 11g is smaller in transistor size than an n-channel type MIS load transistor. Even through the n-type well 10a requires an additional area, the total area does not exceed the occupation area of an n-channel type MIS load transistor.

Heavily doped n-type impurity regions 10h and 10i are formed in another surface portion of the lightly doped p-type semiconductor substrate 10, and a channel region 10j spaces the heavily doped n-type impurity region 10h from the other heavily doped n-type impurity region 10i. The heavily doped n-type impurity regions 10h and 10i serve as the drain node 11hd and the source node 11ha, respectively.

The channel region 10j is covered with a gate insulating layer 10k, and a gate electrode 10m is formed on the gate insulating layer 10k. The gate electrode 10m is corresponding to the gate electrode 11hb.

A heavily doped p-type contact region 10n is formed in the lightly doped p-type semiconductor substrate 10, and is electrically connected to the ground terminal 14. The ground potential biases the lightly doped semiconductor substrate 10 and, accordingly, the channel region 10j. For this reason, the channel region 10j serves as the back gate 11hc.

The heavily doped n-type impurity region 10h is connected to the heavily doped p-type impurity region 10c, and the gate electrode 10m and the heavily doped n-type impurity region 10i are electrically connected to the ground terminal 14 together with the heavily doped p-type contact region 10n.

The gate insulating layers 10e and 10k may be formed of silicon oxide.

While the first-stage inverter circuit 11a is operating with the input signal IN, no punch-through phenomenon takes place in the n-channel type MIS punch-through transistor 11h, and the pad 12 is electrically isolated from the ground terminal 14. The input signal IN is propagated through the resistor 11f to the first-stage inverter circuit 11c, and the first-stage inverter circuit 11c selectively connects the output node 11i thereof to the positive power voltage line Vdd and the ground potential line GND.

If the external lead 13 is, by way of example, unintentionally brought into contact with a charged body, an electrostatic surge is applied through the pad 12 to the p-channel type MIS load transistor 11g.

The slightly conductive channel of the p-channel type load transistor 11g immediately propagates the electrostatic surge through the drain node 11gb (10c) to the gate electrode 11gc (10f). Also, the electrostatic surge is concurrently applied to the source node 11ga (10b), the back gate 11gd (10d), the drain node 11gb (10c) and the gate electrode 11gc (10f). For this reason, the potential difference across the gate insulating layer (10e) is extremely small, and the dielectric breakdown never takes place.

The electrostatic surge is further transferred from the drain node 11gb (10c) to the drain node 11hd (10h) of the n-channel type MIS punch-through transistor 11h. A depletion layer is developed from the drain node 11hd (10h), and extends through the channel region 10j to the source node 11ha (10i). Then, the drain node 11hd (10h) is electrically connected to the source node 11ha (10i), and the resistance between the drain node 11hd (10h) and the source node 11ha (10i) becomes approximately equal to zero. As a result, the electrostatic surge is discharged to the ground terminal 14, and the input protection circuit 11b prevents the first-stage inverter circuit 11c from destruction.

When the n-channel type MIS punch-through transistor 11h starts to discharge the electrostatic surge, the potential level at the gate electrode 11gc (10f) is lowered, and a potential difference takes place between the gate electrode 11gc (10f) and the back gate 11gd (10d). However, the n-channel type MIS punch-through transistor 11h has already pulled down the potential level of the electrostatic surge, and the electrostatic surge can not destroy the gate insulating layer 10e.

As will be appreciated from the foregoing description, the electrostatic surge is concurrently applied to the gate electrode and the back gate of the MIS type load transistor, and the gate insulating layer is hardly broken down. Therefore, the input protection circuit 11b is reliable, and occupies only narrow area of the semiconductor substrate.

Although a particular embodiment of the present invention has been shown and described, it will be obvious to those skilled in the art that various changes and modifications may be made without departing from the spirit and scope of the present invention. For example, an n-channel enhancement type MIS field effect transistor is available for the load element. In this instance, the source-to-drain path is coupled between the pad and the punch-through transistor, and the gate electrode and the back-gate are coupled to the drain. An electrostatic surge is concurrently applied to the gate electrode and the back-gate, and the gate insulating film is prevented from the dielectric breakdown.

Moreover, a semiconductor integrated circuit device may have a plurality of input protection circuits according to the present invention associated with external leads, respectively, and the input signal may be supplied to another logic gate such as a NAND gate or a NOR gate.

What is claimed is:

1. An input protection circuit incorporated in a semiconductor integrated circuit comprising:

an input protection transistor connected to a constant voltage source for discharging a large potential to said constant voltage source; and a first load element connected between an external input terminal, to which said large potential is applied, and said input protection transistor, said first load element comprising a metal-insulator-semiconductor type transistor having a gate and a back-gate which are connected to drain and source nodes of said metal-insulator-semiconductor type transistor, respectively, so as to apply said large potential to both said gate and said back-gate, said source node being electrically coupled to said external input terminal, said drain node being electrically coupled to said input protection transistor;

wherein said input protection transistor has a source region and a drain region electrically connected through a punch-through phenomenon when said large potential is applied to one of said source region and said drain region.

2. An input protection circuit incorporated in a semiconductor integrated circuit comprising:
   an input protection transistor connected to a constant voltage source for discharging a large potential to said constant voltage source; and
   a first load element connected between an external input terminal, to which said large potential is applied, and said input protection transistor, said first load element comprising a metal-insulator-semiconductor type transistor having a gate and a back-gate which are connected to drain and source nodes of said metal-insulator semiconductor type transistor, respectively, so as to apply said large potential to both said gate and said back-gate, said source node being electrically coupled to said external input terminal, said drain node being electrically coupled to said input protection transistor;
   wherein said input protection transistor is formed by an n-channel MIS type punch-through transistor operative to electrically connect a drain node thereof to a source node thereof through a punch-through phenomenon in the presence of said large potential, and wherein said constant voltage source supplies a ground potential to said source node of said n-channel MIS type punch-through transistor.

\* \* \* \* \*